United States Patent [19]

Barsotti

[11] 3,904,977

[45] Sept. 9, 1975

[54] MULTIPLEXING SWITCH WITH WIDE BANDPASS CHARACTERISTICS AND HIGH ISOLATION IMPEDANCE BETWEEN INPUTS

[75] Inventor: Rudolf H. Barsotti, Longmont, Colo.

[73] Assignee: International Business Machines Corporation, Armonk, N.Y.

[22] Filed: Oct. 5, 1973

[21] Appl. No.: 403,759

[52] U.S. Cl. .................... 330/51; 178/50; 307/243; 328/154; 330/22; 330/30 R

[51] Int. Cl.² ........................ H04B 7/02; H03F 1/14

[58] Field of Search ...... 178/50; 179/18 FC, 18 GF; 307/243; 328/154; 330/30 R, 51, 22

[56] References Cited

UNITED STATES PATENTS

| | | | |
|---|---|---|---|
| 2,464,353 | 3/1949 | Smith et al. | 330/51 X |
| 3,158,692 | 11/1964 | Gerkensmeier | 328/154 X |

FOREIGN PATENTS OR APPLICATIONS

| | | | |
|---|---|---|---|
| 1,126,075 | 9/1968 | United Kingdom | 179/18 FC X |

OTHER PUBLICATIONS

McDonald, Jr., "Electronic Switching For Class A Signals," IBM Technical Disclosure Bulletin, Vol. 9, No. 6, November 1966 (307-243).

*Primary Examiner*—R. V. Rolinec
*Assistant Examiner*—Lawrence J. Dahl
*Attorney, Agent, or Firm*—Homer L. Knearl

[57] ABSTRACT

The multiple-input, common-output switch disclosed herein has a wide bandpass characteristic of approximately 0 to 90 Megahertz and is thus capable of passing most any digital or analog signal. At the same time, high isolation is maintained between each of the inputs and the common output so that many inputs may be gated by the switch to the single common output. The switch contains two stages of amplification. The input amplifier consists of a transistor for amplifying the input signal applied to its base, and a current control transistor for starving or supplying current to the input transistor. When the input transistor is turned off by current starvation, the off condition of each input amplifier is sensed by a bias circuit. The bias circuit feeds back a voltage level to the collector of the input transistor insuring that the collector - base junction of the input transistor is reverse biased. The second amplifier is an isolation amplifier configured as an emitter follower OR circuit. When the off condition of the input transistor is sensed, the isolation amplifier is reverse biased across its emitter-base junction. Thus, an amplifying stage controlled by current starvation and an amplifying stage performing a logical OR function have been combined with a bias arrangement enabling both amplifiers to be driven on with wide band characteristics, or to be reverse biased off to achieve high isolation.

8 Claims, 4 Drawing Figures

MULTIPLEXING SWITCH WITH WIDE BANDPASS CHARACTERISTICS AND HIGH ISOLATION IMPEDANCE BETWEEN INPUTS

BACKGROUND OF THE INVENTION

1. Field of the Invention

This invention relates to a switching circuit for use in multiplexing multiple inputs to a common output. More particularly, the invention relates to a switching circuit capable of either gating analog or digital signals, and having extremely high isolation between the common output and each input whereby many inputs may be selectively connected one at a time to the same common output.

2. State of the Art

Multiplexing switches for selectively connecting one input from multiple inputs to a single common output are well known. Typically, this has been done in the past by utilizing an input transistor which may be turned on and off by enabling or inhibiting a current source supplying current to the input transistor. This is known in the art as switching a transistor by depletion or starvation of current to the transistor. The input signal is supplied to the base of the input transistor and is typically taken from the collector of the input transistor. Collectors of different input transistors are then tied together to a single load to provide the common output for the multiplexing switch.

An additional refinement for the above prior art switch is the placement of a diode between the collector terminal of each input transistor and the common output line for the switch. Each diode enhances isolation between the common output and the input signal on its input stage when the input stage is current starved. The enhancement occurs when the input signal to the off stage goes above the voltage level of the signal on the common output line. Under this condition the diode is reverse biased. An example of this multiplexing switch is shown in U.S. Pat. No. 3,638,131, issued Jan. 25, 1972.

While the performance of the above prior art circuit is good, the objective of the present invention is to provide still greater isolation for multiplexing switch. Limitations on isolation in the prior art switch are caused by its use of the diodes for enhancing the isolation. As will be described hereinafter, the invention uses alternative isolation circuitry along with the depletion or starved transistor input stage to obtain at least one order of magnitude improvement in isolation.

Still another objective of the invention is to provide a wide bandpass multiplexing switch over a more diverse range of circuit implementations than previously available with prior art multiplexing switches. The above-described switch of U.S. Pat. No. 3,638,131 can have excellent bandpass characteristics, but it is limited in that to do so it must be implemented with integrated circuits of a certain type. In particular, to have an optimum bandpass characteristic, this prior art switch must be implemented with an integrated circuit where the diode is obtained by an additional semiconductive layer bonded to the collector of the input transistor, and the capacitance from the input transistor to the substrate must be in the order of 20 times greater than the capacitance across the diode junction. In other words, there is approximately a 20 to 1 ratio between the capacitance of the transistor-to-substrate and the capacitance across the diode junction. Today the integrated circuit technology has improved to the point where this ratio, instead of 20 to 1, would more likely be 2 to 1. With a 2 to 1 capacitance ratio the bandpass characteristic of the switch in U.S. Pat. No. 3,638,131 would be greatly reduced.

While the prior art multiplexing switches are capable of wide bandpass characteristics, they do require specific integrated circuit implementation to obtain such a characteristic. As stated above, the objective of the present invention is a multiplex switch having wide bandpass characteristics which may be implemented with any integrated circuit configuration, or even individual components mounted on printed circuit boards. In other words, the inventive circuit may be implemented with any technology and still achieve the wide bandpass characteristic.

SUMMARY OF THE INVENTION

In accordance with this invention, the above objects have been accomplished by providing two stages of amplification between each input signal and the common output, and by biasing the two stages simultaneously into an amplification state or an isolation state in response to a selected or non-selected condition applied to the input amplifying stage. A bias circuit in each input stage is shared by both amplification stages (input and isolation) and causes both amplification stages to track a selected or non-selected condition applied to each input stage.

As a further feature of the invention, the input stage is current controlled to select on or off, and a bias circuit changes the bias to the amplification stages in response to the current control condition. In an off or non-selected condition, the input stage is current starved. This current starved or depletion condition is detected by the biasing circuit and used to reverse bias both the first or input stage and the second or isolation stage. Thus, when an input stage is non-selected or off, that stage and its associated isolating amplifying second stage are both reverse biased.

In addition, the output of the isolating amplifying second stage is connected to a common point with all other isolating amplifying second stages in the multiplex switch. One of these second stages will be the selected stage and will be in an on condition. The isolating amplifying stage, when in an on condition, is designed such that looking back into the isolating stage from the common output a very low impedance is seen in comparison to the output impedance. Therefore, any noise passing through a non-selected isolating amplifying second stage will be driven into the low impedance of the selected second stage rather than out the high impedance common output line.

As one application of the invention, a tree-structure multiplexing interface between data-processing peripheral equipment and data-processing control units is built up with the inventive multiplex switch. The tree has two layers of multiplex switches. These switches are configured so that each control unit can be connected to any one of the peripheral units. Typically, the peripheral units would be magnetic storage devices such as magnetic disc recorders or magnetic tape recorders.

The great advantage of my invention is the extreme isolation that exists between common output line and each of the non-selected inputs. This isolation ratio is in the order of $10^{-6}$ at 10 Megahertz for a signal component on the common output contributed by a nonselected input line. In addition, the bandpass characteristic, 0 to 90 MHz, of the switch is extremely large because of the very small capacitances that exist in the circuit components. Both the isolation and the bandpass characteristic are not impacted by adding further stages to the multiplexing switch so as to enlarge its size. This is due to the fact that the connection to the common output is through an amplifying stage.

The foregoing and other objects, features and advantages of the invention will be apparent from the following more particular description of preferred embodiments of the invention as illustrated in the accompanying drawings.

DETAILED DESCRIPTION

Figure 1:
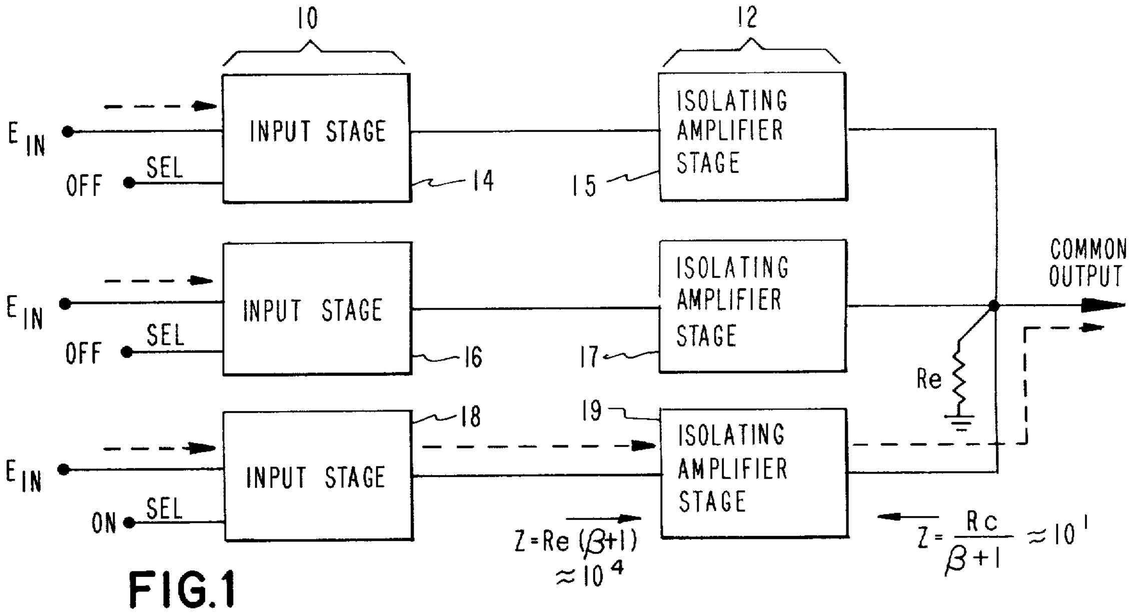
FIG. 1 shows a schematic block diagram of the multiple input common output switch.

In the FIG. 1 schematic block diagram of the invention, the multiplexing switch has been divided into input stages 10 and isolating amplifier stages 12. Each input stage 10 is paired with an isolating amplifier stage 12. In FIG. 1 there are three pairs of input stages coupled with isolating amplifier stages; i.e., input stages 14, 16 and 18 have their output coupled to isolating amplifier stages 15, 17 and 19, respectively.

Both the input stages 10 and the isolating stages 12 amplify the input signal. The selection of the input channel to be electrically coupled to the common output occurs at the input stages 10. The isolating amplifying stages 12 track the selected or non-selected condition of their associated input stage. Thus, if an input stage 18 is selected as shown in FIG. 1, isolating amplifier stage 19 is also selected, and two stages of amplification are applied to the input signal prior to it reaching the common output line.

The amplification that occurs in the isolating stage is of particular significance in providing the high degree of isolation between the common output and non-selected inputs. This is most clearly understood by examining what the impedance looks like at various points in the multiplex switch of FIG. 1. With input stages 14 and 16 selected off and input stage 18 selected on, isolating stages 15 and 17 will also be off while isolating stage 19 is on. Thus, the signal $E_{IN}$ applied to input stage 18 is passed through the input stage 18 and through the isolating amplifier stage 19 to the common output.

The load seen by each of the isolating amplifier stages is the resistor $R_e$ connected to the common output. It is assumed that the multiplex switch is driving into a high impedance load connected to the common output; therefore, the load to the selected isolating amplifying stage that is on will be the resistor $R_e$. For all practical purposes, the impedance looking into the isolating amplifier stage 19 from input stage 18 is resistor $R_e$ multiplied by the gain of the amplifying stage ($\beta + 1$) where $\beta$ is the amplification factor of the transistor used in the stage. Typically, $R_e$ might be a 1K resistor and the $\beta$ of the transistor might be 40. Thus the approximate impedance looking into the selected amplifying stage 19 would be 40K, or in the order of $10^4$ ohms.

The non-selected isolating stages 15 and 17 provide no load to the isolating amplifier stage 19 because they are reverse biased when non-selected and thus provide extremely high impedance in the order of megohms. In addition, non-selected amplifier stages 15 and 17 are in series with non-selected input stages 14 and 16 which are also reverse biased. Thus, the reverse biased input stages 14 and 16 provide an additional impedance in the order of megohms. Accordingly, the feedback of signal on the common output to non-selected input stages is practically nonexistent.

The more serious problem in isolation is isolating non-selected input signals from feed forward to the common output. Because input stages 14 and 16 and isolating stages 15 and 17 are reverse biased, the impedance to an input signal reaching the common output from a non-selected input is equivalent to several megohms. However, it can be expected that some noise to the input signals will reach the common output, and it is at this point that the amplification condition of stage 19 again becomes most valuable. A noise signal from either amplifying stage 15 or 17 looking at the common output line will see the lowest impedance back through the isolating amplifier stage 19. Effectively, the impedance on the input side of the isolating amplifying stage 19 is divided by the gain of the stage which is $\beta + 1$. For a resistance $R_e$ in the order of 1K, the effective impedance as seen looking back into the isolating amplifier stage is 1K divided by 41, or approximately 25 ohms; i.e., in the order of $10^1$ ohms. This impedance is much lower than the 1K resistor $R_e$ and the very high impedance to which the common output would be connected. Thus, any noise signal that does manage to get through a non-selected input stage 14 and a non-selected isolating amplifier 15 will essentially be dissipated back through the isolating amplifier stage 19 and not appear at the common output.

While the multiplexing switch in FIG. 1 has been shown with only three inputs, it can be appreciated from the high degree of isolation just described that many inputs might be similarly attached through an input stage and an isolating stage to the common output without deteriorating the isolation characteristics of the multiplexing switch. Certainly 20 inputs to be multiplexed would present no problem.

Figure 2:
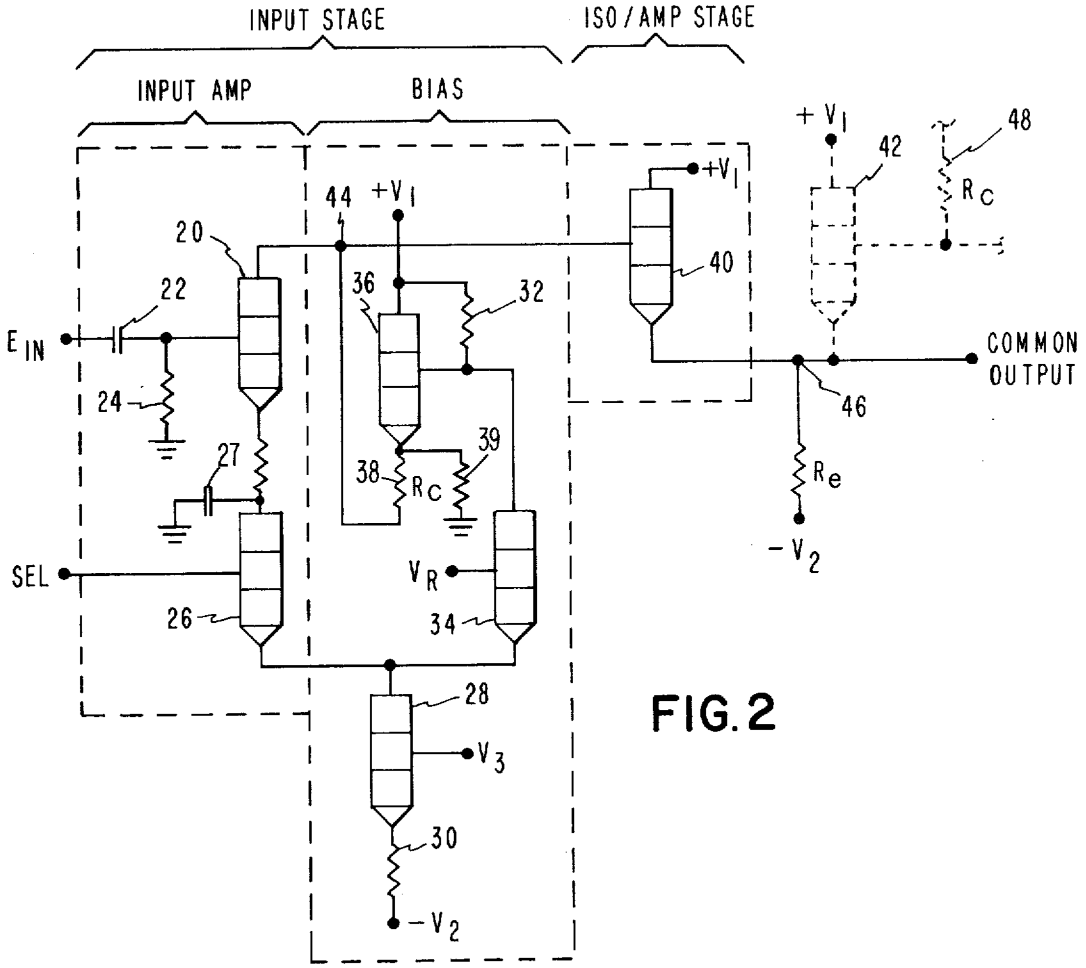
FIG. 2 is a detailed circuit diagram for one embodiment of a single channel of the switch containing an input stage and an isolating amplifying stage.

Now referring to FIG. 2, the circuit schematic for a single input stage and its associated isolating amplifying stage is shown. The input stage may be divided into two portions — an input amplifier and a bias circuit. The bias circuit is of particular interest in that it is the apparatus whereby it is possible to combine two amplifying stages and achieve the high degree of isolation between a common output and a given input. This will become more clear as the circuits of FIG. 2 are described below.

The input amplifier consists simply of an input transistor 20 for amplifying the input signal applied to its base. The input signal is coupled to the base of transistor 20 through an AC coupling network consisting of capacitor 22 and resistor 24. Transistor 26 is a current control transistor which either permits or inhibits current from being supplied. to the transistor 20. When transistor 26 is turned on by a select signal applied to its base, transistor 20 is active to amplify the input signal. Capacitor 27 provides a current path for the amplified input signal around a current source that supplies the bias current to transistor 20. When transistor 26 is cut off by a non-select condition applied to its base, transistor 20 is current starved or depleted so as to cease operation.

The current, which is either supplied to transistor 20 or starved from transistor 20 by transistor 26, comes from transistor 28 in the bias circuit. Transistor 28 with its resistor 30 acts as a current source. It is driven by the voltage $V_3$ applied to its base which is higher than the negative voltage $V_2$. Current supplied by transistor 28 is either directed through transistor 20 or through resistor 32 by the on or off conditions of transistors 26 and 34, respectively. When the select voltage applied to the base of transistor 26 is higher than the reference voltage $V_R$ applied to the base of transistor 34, transistor 26 is conductive while transistor 34 is cut off. Thus, the current from current source 28 will activate input transistor 20. With transistor 34 cut off, there will be little or no voltage dropped through resistor 32. Thus, the voltage at the base of transistor 36 will be very nearly $+V_1$, and the voltage at the emitter of transistor 36 will be $+V_1$ less the base to emitter voltage ($\sim$½ volt). Therefore, the voltage at the emitter of transistor 36, when transistor 34 is cut off, will be very nearly the voltage $+V_1$. This biases transistor 20 during its conducting condition through its collector resistor 38 ($R_c$).

The isolation amplifier stage consists solely of a transistor 40 that drives into the load resistance $R_e$ common to all the isolation amplifier stages. Whether transistor 40 is active as an amplifier or is reverse biased depends upon whether the voltage applied to its base is greater than the voltage supplied to the bases of the other isolation amplifier stages represented by the phantom transistor 42 in FIG. 2. As will be clear shortly, the voltage applied to the base of transistor 40 will be higher than the voltage applied to the base of transistor 42 when the input stage associated with transistor 40 is selected on while the input stage associated with transistor 42 is selected off. This can be seen by examining the voltages at the collector of transistor 20 when the input stage of FIG. 2 is selected on and then selected off.

As just described above, when the input amplifier is selected on by turning on transistor 26, the voltage at the collector of transistor 20 will be $+V_1$ less the voltage drop across resistor 38 due to current from the current source 28 and current due to amplification of the input signal applied to the base of transistor 20.

On the other hand, when the input amplifier is selected off, transistor 26 turns off and transistor 34 in the bias circuit turns on. With transistor 34 on, the current from current source 28 is directed through resistor 32. The voltage drop across resistor 32 is sizeable and greatly reduces the voltage applied to the base of transistor 36. Transistor 36 is driving into resistor 39 in this off condition for the input stage. Since transistor 20 is off, transistor 36 cannot drive into it via resistor 38. The emitter of transistor 36 follows its base voltage very closely. Thus the emitter voltage at transistor 36 for the off condition of the input stage is very much lower than the emitter voltage for the on condition of the input stage because of the voltage drop across resistor 32.

Further, since transistor 26 is off, transistor 20 and resistor 38 are current starved so that the voltage drop across resistor 38 is very nearly zero. Therefore, the voltage at the collector of transistor 20 will be approximately the voltage $+V_1$ less the very significant voltage drop due to all of the current from the current source 28 passing through resistor 32. In this way, the voltage at the collector of transistor 20, and thus the base of transistor 40, can be dropped several volts from the on condition of the input stage to the off condition of the input stage. With emitters of the isolation amplifier stages connected in common to the load resistor $R_e$, this will assure that only one isolation amplifier stage is on and amplifying at any time. The isolation amplifier stage, which is on, will be the stage associated with the input stage selected on.

Operation of FIG. 2 Embodiment

To recap, the input stage operates with the isolation amplifier stage as follows. The input signal $E_{IN}$ is AC coupled to the input transistor 20. The input amplifier is active to amplify the input signal or is inhibited to isolate the input signal by the current control transistor 26. Current control transistor 26 supplies current to transistor 20 when a select signal is present at its base, or starves current from transistor 20 when there is no select signal applied to its base.

The isolation amplifier stage tracks the state, selected or non-selected, of the input amplifier. If the input amplifier is selected, the isolation stage further amplifies the signal received from the collector of the input transistor 20. If the input amplifier is non-selected, then transistor 40 of the isolation amplifier stage is inhibited to provide an additional high impedance isolation stage between the input signal and the common output.

Control of the input amplifier and the isolation amplifier is coordinated by the bias circuit in the input stage. The bias circuit, when the input amplifier is selected on, supplies the current to drive the input transistor 20. At the same time, the bias circuit provides the proper bias at the collector of transistor 20 and the base of transistor 40 (isolation amplifier stage) to insure that both transistors are in an amplifying state of operation.

On the other hand, when the input amplifier is selected off, the bias circuit detects this condition and provides a bias to the collector of transistor 20 and the base of transistor 40 to insure that both transistors are reverse biased. For transistor 20 the bias circuit insures the reverse biasing of the base to collector junction, while for transistor 40, the bias circuit insures the reverse bias of the base to emitter junction.

The isolation characteristic of the invention can be best understood by examining the impedance looking into the isolation amplifier stage of FIG. 2 from both its input side and its output side. Looking from node 44 into the input of the isolation amplifier stage it is clear that the impedance will be the load resistance $R_e$ multiplied by the gain of the amplifying stage which is $\beta +$ 1, where $\beta$ is the current multiplication factor of the transistor 40. Transistor 42, because it is back biased, and the common output, because it would be connected to a high impedance, would have no effect on the impedance $R_c(\beta+1)$ as seen at node 44 looking into the isolation amplifier stage.

Looking back through the isolation amplifier stage from node 46, the impedance seen is $R_c$ (resistor 38) divided by the gain of the isolation amplification stage; i.e., $R_c/(\beta+1)$.

In the event that transistor 40 were off and transistor 42 were on (multiplex switched to another input channel), then noise signal passing through transistor 40 would see a low impedance $R_c$ divided by $\beta+1$ which is now due to resistor 48 and the gain of transistor 42. Therefore, irrespective of which channel is selected in the multiplex switch, noise passing through non-selected channels will also see a very low impedance back through a selected channel, and thus will have little effect on the common output.

Bipolar Embodiment

Figures 3, 4:
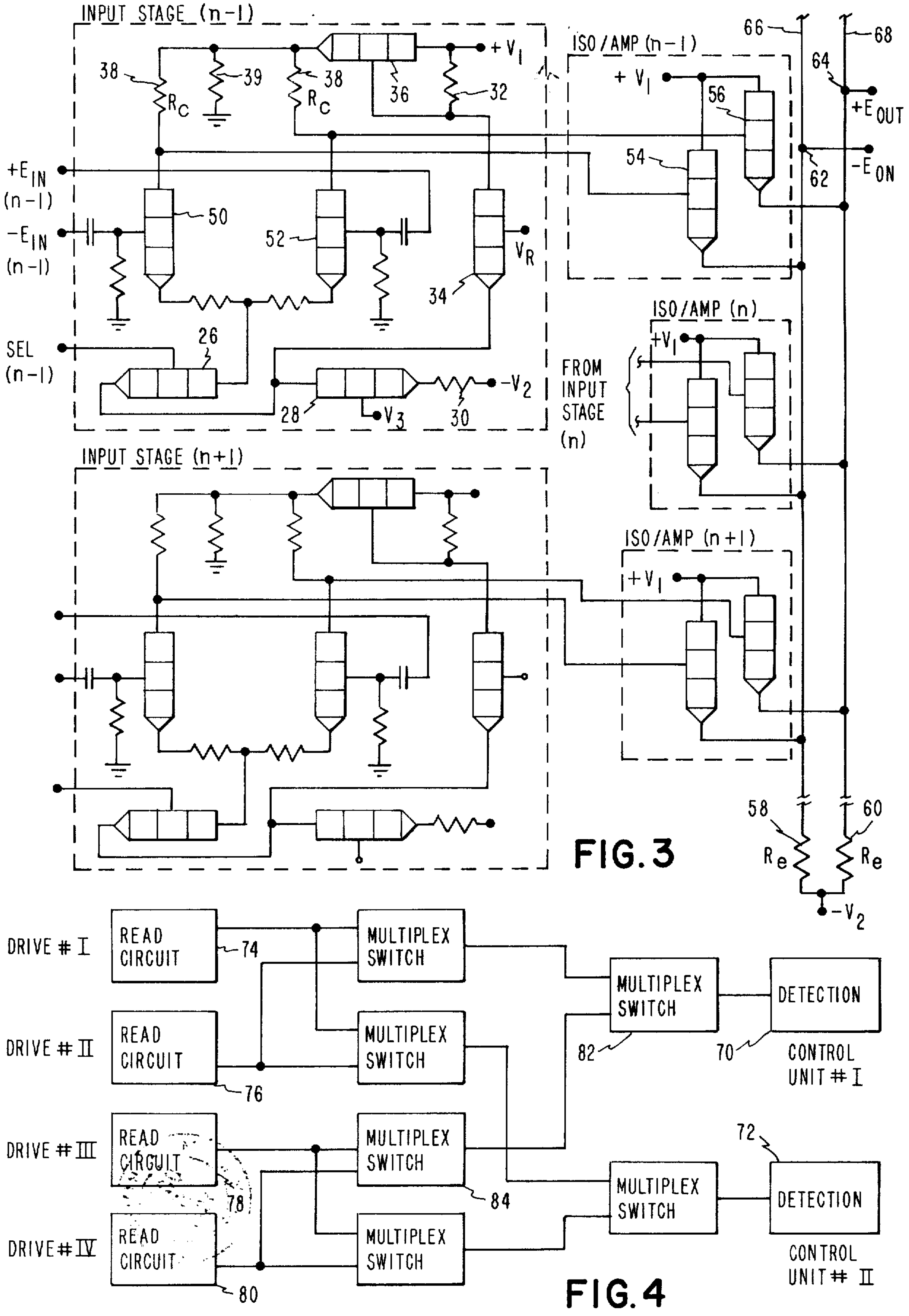
FIG. 3 is a circuit schematic of another embodiment of the invention having bi-polar input signals and bipolar common output lines. Two complete channels of the multiplexing switch and a portion of a third channel containing only the isolation amplifier are shown.
FIG. 4 shows a plurality of the multiplexing switches utilized to form a two-layer tree to connect each of two control units to any one of four magnetic recording drive units.

In FIG. 3, the multiplex switch is shown implemented in a bipolar signal environment and having a plurality of channels diagrammed. Circuit elements performing the same function have been given the same reference numerals in FIGS. 2 and 3. The common circuit components are the bias circuit components and also the current control transistor 26. In addition, two $R_c$ resistors 38 are shown in the input stages of FIG. 3 because of the bipolar nature of the input.

In FIG. 3, the bipolar operation is achieved by providing two input transistors 50 and 52 which are AC coupled to the input signals. The output from the bipolar input stage is taken off of the collectors of transistors 50 and 52 and applied to a bipolar isolation amplifying stage now consisting of two transistors 54 and 56. Because of the bipolar nature of the signals, transistors 54 and 56 drive into separate load resistors 58 and 60 of identical value $R_c$. The bipolar output is taken off of the load resistors 58 and 60 at nodes 62 and 64, respectively.

FIG. 3 is also of interest in that it represents a multichannel multiplexing switch. The channels shown are identified as $n-1$ and $n+1$. In addition, the open-ended nature for the number of channels that may be incorporated is represented by the fact that the common output lines 66 and 68 are left open-ended. In FIG. 3, channels $n-1$ and $n+1$ are shown complete. For channel $n$, only the isolation amplification stage is shown.

Operation of the channels in FIG. 3 is identical to the channel described in FIG. 2 except that the input signal and output signal is now bipolar. Accordingly, two input transistors are required along with two isolation amplification transistors for each channel.

Also note that two collector resistors 38 are required for each input stage. The resistor 39 in the input stage is the bias resistor for transistor 36 to drive into when transistors 50 and 52 are off. Also, to operate with bipolar signals, two common output lines 66 and 68 are required, each of which has a resistive load $R_c$ (resistors 58 and 60).

Referring now to FIG. 4, a well known two-layer, channel-switching tree is shown which can be considerably enhanced by the performance of the multiplex switch described in FIGS. 1 through 3. Two-layer switching tree has the capability of connecting either control unit I or II to any of the drive units I through IV. Typically, the control units I and II contain detection and error correction circuits 70 and 72. The drive units I through IV contain read circuits 74, 76, 78 and 80. Read circuits are used with magnetic recording devices and consist of preamplifiers and gain control circuits to shape the signal prior to its being applied to a channel for passage to the detection circuits 70 and 72.

By using two layers of multiplex switching, where each multiplex switch has only two inputs, detection circuit 70 can receive data signals from any of the read circuits 74 through 80. For example, detection circuit 70 can receive data signals from read circuit 80 via multiplex switch 82 and multiplex switch 84. Likewise, detection circuit 72 may receive data signals from any of the read circuits 74 through 80.

It will be appreciated by one skilled in the art that a very simple tree arrangement has been diagrammed in FIG. 4, that many more control units and many drives might be connected by utilizing more inputs per multiplex switch. Because of the high isolation characteristics between output and input in the multiplex switch of FIG. 3, the inventive switch materially enhances the ability to direct data over a channel from a plurality of drive units to any given control unit.

Furthermore, while the invention has been described with a particular circuit configuration, it will be appreciated by one skilled in the art that similar input stages with bias circuits and isolating amplifying stages that track the input stages might have different circuit schematics and still perform the functions described herein. Furthermore, the implementation of this circuitry in either individual circuit components on circuit boards or integrated circuit modules is immaterial. In summary, while the invention has been particularly shown and described with reference to preferred embodiments thereof, it will be understood by those skilled in the art that the foregoing and other changes in form and details may be made therein without departing from the spirit and scope of the invention.

What is claimed is:

1. Apparatus for isolating non-selected input signals from the output in a multiple-input, common-output switch comprising:

an input stage for each input signal paired with an amplifying isolating stage connected between each input stage and the common output;

each of said input stages being operative in a selected mode for amplifying and passing an input signal to the paired isolating stage and being operative in a non-selected mode for blocking an input signal from reaching the paired isolating stage;

each of said amplifying isolating stages tracking the mode of the paired input stage and operating in the same mode as the paired input stage whereby both the input stage and the isolating amplifying stage in each pair of stages are simultaneously amplifying or blocking;

said isolating stage in a selected mode for amplifying the input signal passed by the paired input stage and applying the signal to the common output;

said isolating stage in a non-selected mode providing a high impedance block between the common output and the paired input stage to any remanent signal not blocked by the paired input stage;

said isolating stage in a selected mode further providing a low impedance shunt path away from the common output for any remanent signal from non-selected paired stages.

2. The apparatus of claim 1 wherein said input stage comprises:

a semiconductive means for amplifying the input signal to pass the signal to the paired isolating stage when selected and for blocking the input signal from the paired isolating stage when non-selected;

control means connected to said semiconductive means for supplying or starving bias current to said semiconductive means so that said semiconductive means is controlled to be conducting when selected or non-conducting when non-selected respectively.

3. The apparatus of claim 2 wherein said isolating stage comprises:

a second semiconductive means connected to said control means being biased conductive or non-conductive by said control means when said control means is supplying or starving current respectively.

4. A multiple-input, common-output switching apparatus with a first and a second semiconductor junction between each input and the common output comprising:

a selectable current control means for supplying or depleting current through the first junction so as to enhance or inhibit, respectively, passage of input signal to the second junction;

bias means connected to said first and second semiconductor junctions and responsive to a depletion condition from said current control means for reverse biasing both said first and second junctions relative to the common output to inhibit passage of any noise signal to the common output;

said bias means responsive to a supply condition by said current control means for biasing both said first and second junctions into an amplification operation whereby the selected current condition in said current control means controls the switching of selected input to the common output.

5. The method of claim 4 and in addition:

said second junction when biased into the amplification operation driving the input signal onto the common output line and providing a low impedance path to any noise signal from any reverse biased second semiconductor junction connected to the common output.

6. A switching array for selecting one of plurality of inputs for passage to a single output in response to a selected condition wherein each selectable channel in the array comprises:

a first amplifier means for amplifying the input signals when selected and for providing a first level of isolation from the output when non-selected;

a second amplifier means connected between the output of said first amplifier means and said single output for amplifying the signal from said first amplifier when said first amplifier means is selected and for providing a second level of isolation from said single output when said first amplifier means is non-selected;

bias means shared by said first and second amplifier means responsive to the select condition for biasing both amplifying means simultaneously into isolation or amplification depending on the select condition.

7. The switching array of claim 6 wherein said bias means comprises:

means for supplying current to said first amplifier means when selected and for depleting current in said first amplifier means when non-selected;

means responsive to said supplying means for changing voltage bias levels on said first and second amplifier means from biased on when selected to reverse biased when non-selected.

8. The switching array of claim 7 wherein said means for supplying and depleting comprises:

a current source;

means for switching substantially all of the current from said current source either to said first amplifier means when the channel is selected or to said voltage changing means when the channel is nonselected.

* * * * *